United States Patent [19]

Mohri et al.

[11] Patent Number: 4,613,925
[45] Date of Patent: Sep. 23, 1986

[54] SENSOR ATTACHMENT ASSEMBLY

[75] Inventors: Akira Mohri, Fukui; Akira Oyama, Takefu, both of Japan

[73] Assignee: Murata Manufacturing Co., Ltd., Kyoto, Japan

[21] Appl. No.: 627,004

[22] Filed: Jul. 2, 1984

[30] Foreign Application Priority Data

Jul. 5, 1983 [JP] Japan ................. 58-122776

[51] Int. Cl.$^4$ ................................. H05K 7/12
[52] U.S. Cl. .................... 361/420; 361/386; 361/400; 361/417
[58] Field of Search ............. 174/16 HS, 52 FP; 324/61 R, 65 R; 361/386, 387, 389, 400, 417, 419, 420, 429, 399

[56] References Cited

U.S. PATENT DOCUMENTS

| | | | |
|---|---|---|---|
| 3,047,648 | 7/1962 | Mowatt | 361/417 |
| 3,519,889 | 7/1970 | Monaco | 361/400 |
| 3,849,838 | 11/1974 | Hehl | 361/417 |
| 4,343,451 | 8/1982 | Armstrong | 361/417 |
| 4,435,724 | 3/1984 | Ralstin | 174/52 FP |

FOREIGN PATENT DOCUMENTS

| | | | |
|---|---|---|---|
| 0239222 | 6/1962 | Australia | 361/400 |
| 2839458 | 3/1979 | Netherlands | 361/386 |

Primary Examiner—A. D. Pellinen
Assistant Examiner—Gregory D. Thompson
Attorney, Agent, or Firm—Birch, Stewart, Kolasch & Birch

[57] ABSTRACT

An assembly suitable for mounting an electronic circuit element, such as a moisture detecting element, comprises a base member having apertures therein, and a supporting member having hooked projections passing through the apertures fastening the electronic circuit element to the base member. The supporting member from which the hooked projections project is positioned under the base member. Additional projections may be provided which pass through second apertures to prevent the circuit element from being moved. The additional projections extend from the supporting member. The base member may be a part of a moisture-sensed sample.

2 Claims, 3 Drawing Figures

SENSOR ATTACHMENT ASSEMBLY

BACKGROUND OF THE INVENTION

The present invention relates to a sensor and, more particularly, to a sensor attachment assembly having good reliability and productivity.

Conventionally, a sensor, in particular, a moisture detecting element or moisture sensor is attached and joined to a sensed body by an adhesive. In such an arrangement, the adhesive may generate gas while the sensor is in use damaging the sensor. Moreover, since the adhesion of the adhesive may be reduced initially, the sensor may be detached from the sensed body. Additionally, the usage of adhesive requires additional time because more than several minutes is needed to cure the adhesive.

Alternatively, the sensor may be attached to the sensed element by screws. For this purpose, tapped holes are formed in the sensed body and corresponding apertures are formed in the sensor for the screws to pass through. However, as a substrate of the moisture sensor is made of a ceramic, the fastening of the screws may cause the substrate to be broken or cracked. Therefore, neither the usage of adhesive nor of fastening screws is suitable in practice.

SUMMARY OF THE INVENTION

With the foregoing in mind, it is an object of the present invention to provide an improved sensor attachment assembly.

It is another object of the present invention to provide an improved sensor attachment assembly devoid of any adhesive or fastening screws.

It is a further object of the present invention to provide an improved sensor attachment assembly comprising a frame for fixing a sensor on a substrate with the frame having members extending through apertures in the substrate to fasten the sensor.

Other objects and further scope of the applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Pursuant to a preferred embodiment of the present invention, an assembly suitable for use as a moisture sensor comprises a substrate for mounting a sensing part, a base member having apertures therein and a supporting member having hooked projections extending therefrom. The hooked projections pass through the apertures and hold the substrate in place. The supporting member may have additional projections extending therefrom which pass through additional apertures in the base member in order to ensure that the substrate does not move. The base member includes a support portion which has the apertures and an attachment portion which is fixed to the body or sample to be sensed.

In another preferred embodiment of the present invention, the base member may be omitted. In this case, apertures are formed in the body to be sensed and the hooked projections and projections extending from the supporting member directly engage the substrate.

BRIEF DESCRIPTION OF THE DRAWINGS

The present invention will become more fully understood from the detailed description given hereinbelow and the accompanying drawings which are given by way of illustration only, and thus are not limitative of the present invention.

DESCRIPTION OF THE PREFERRED EMBODIMENTS

Figure 1:
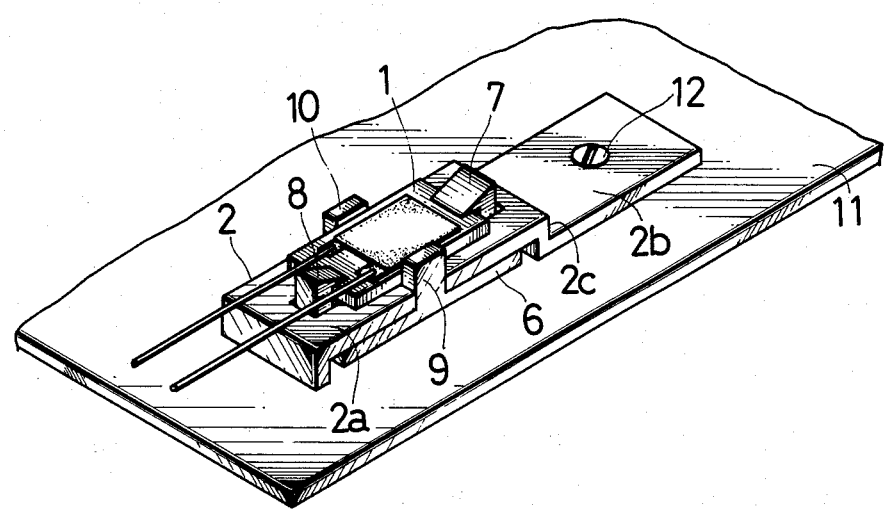
FIG. 1 is a perspective view of a sensor attached to a body to be sensed in accordance with a first preferred embodiment of the present invention.
Figure 2:
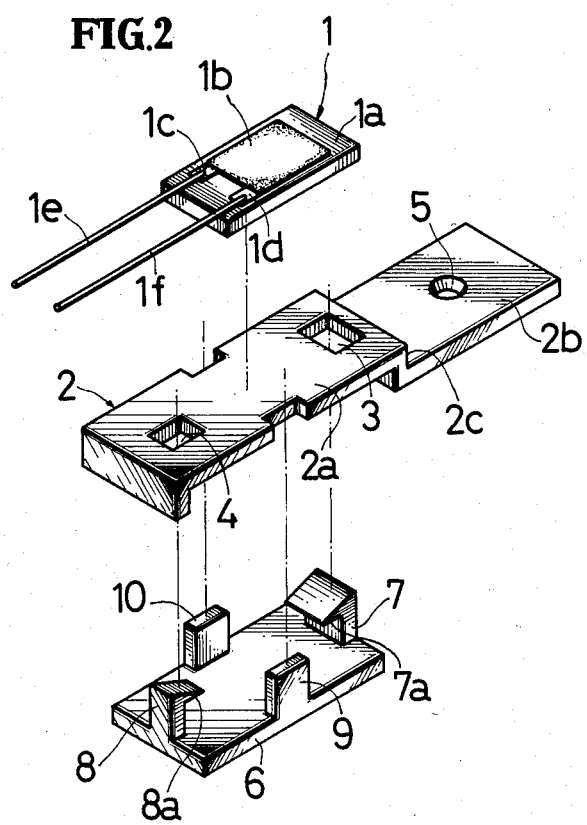
FIG. 2 is an exploded perspective view of the sensor and supporting members of FIG. 1.

With reference to FIGS. 1 and 2, a sensor or electronic circuit element 1, for example, a humidity sensor or moisture detecting element comprises a ceramic substrate 1a, a sensing part 1b, a pair of terminal electrodes 1c and 1d, a pair of lead electrodes 1e and 1f. The sensor is not limited to this configuration. A metallic pedestal or base member 2 is provided for supporting the sensor 1. The pedestal 2 comprises a support portion 2a for holding the sensor 1, an attachment portion 2b attached to a body to be sensed 11, and a step portion 2c extending between support portions 2a and 2b. The height of the step portion 2c is selected so that the plane covering the attachment portion 2b and a supporting member 6 for supporting the sensor 1 is flat. A pair of apertures 3 and 4 are formed in the supporting portion 2a of the pedestal 2. An aperture 5 is provided at the general center of the attachment portion 2b. A supporting and fastening member 6 made of insulating material is provided for supporting the sensor 1. The member 6 is positioned under the support portion 2a of the pedestal 2, comprising a pair of hooked projections on projected frames 7 and 8. Each of the frames 7 and 8 is inserted through each of the apertures 3 and 4 and extends above the support portion 2a. Each of the frames 7 and 8 comprises hooks 7a and 8a at each tip projecting toward each other. A pair of projections 9 and 10 are provided at the widthwise edges of the supporting member 6 and pass through openings in the sides of support portion 2a in a coupling manner. When the supporting member 6 is disposed under the pedestal 2, the projections or positioning members 9 and 10 extend above the supporting portion 2a, passing through the sides of the portion 2a.

While the sensor 1 is mounted on the top surface of the support portion 2a of the pedestal 2, between the pair of apertures 3 and 4, the supporting member 6 is attached to the bottom surface of the support portion 2a with the frames 7 and 8 inserted through the apertures 3 and 4. The hooks 7a and 8a of the frames 7 and 8 are engaged with the lengthwise edges of the ceramic substrate 1a of the sensor 1 to thereby support and fix the sensor 1 on the pedestal 2. The tips of the frames 7 and 8 are snapped somewhat outwardly when the sensor 1 is placed between the tips. Thus, the sensor 1 is tightly bound and stressed by the snap action of the hooks 7a and 8a. The projections 9 and 10 function to prevent the sensor 1 from being misplaced and shifted with bonded by the frames 7 and 8. The provisions of projections 9 and 10 can be omitted. It may be possible that the projections 9 and 10 are not projected from the support member 6, but mounted on the pedestal 2. After the sensor 1 is supported and mounted on the pedestal 2, the pedestal 2 is fastened on a sample or body 11 to be moisture-sensed by putting a screw 12 in an aperture 5 in the attachement portion 2b of the pedestal 2.

Figure 3:
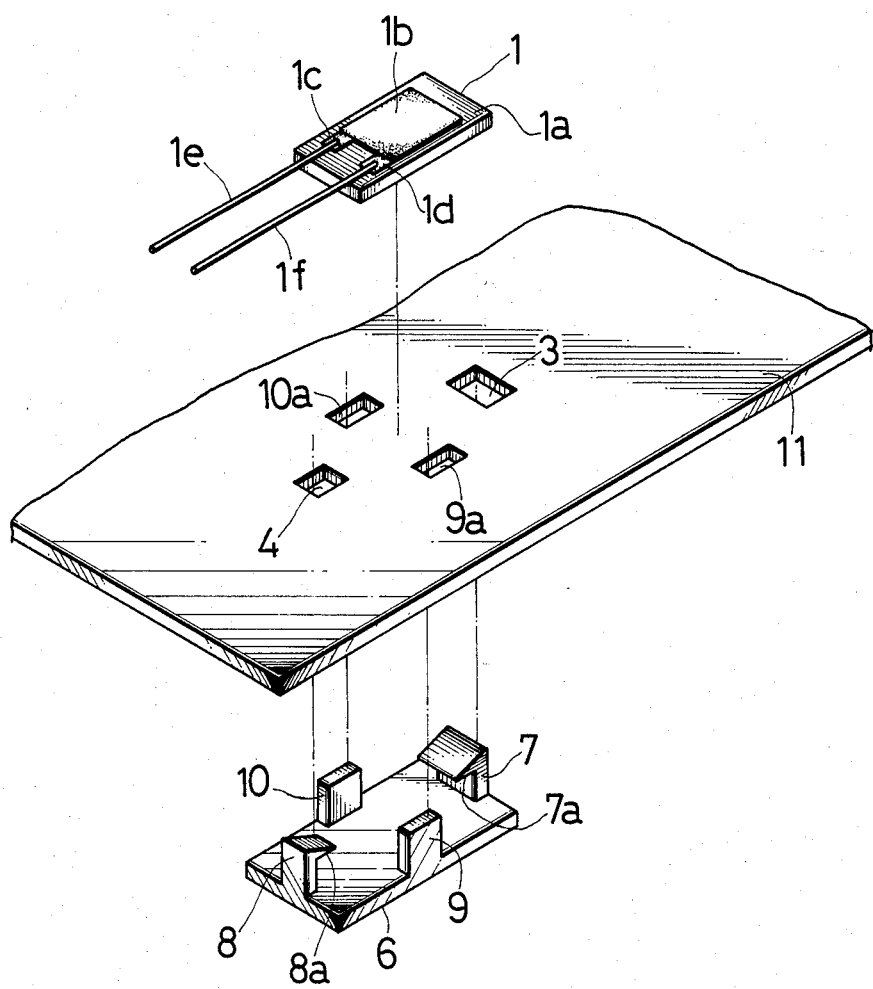
FIG. 3 is an exploded perspective view of a sensor attached to a sensed body in accordance with a second preferred embodiment of the present invention.

FIG. 3 is an exploded perspective view of a sensor attached to a body to be sensed in accordance with a second preferred embodiment of the present invention. Like elements corresponding to those of FIGS. 1 and 2 are indicated by like numerals.

The embodiment of FIG. 3 is the same as the embodiment of FIGS. 1 and 2, except that the pedestal 2 of FIGS. 1 and 2 is served by a part of the body to be sensed 11. In FIG. 3, the attachment portion 2b of the pedestal 2 can be eliminated. A pair of apertures 9a and 10a are provided for receiving the projections 9 and 10.

The provisions of the hooks 7a and 8a can be omitted at the tips of the frames 7 and 8. The frames 7 and 8 are at a slant or angle and thus engage the sensor 1 on the pedestal 2 to fix it in place. The positions, the shapes, and the number of the frames 7 and 8, and the hooks are not limited to the above description. The shape of the pedestal 2 can be selected freely as far as the sensor 1 mounted on the pedestal 2 is concerned since it is fixed by the frames 7 and 8 projecting from the supporting member 6 which is positioned beneath the bottom surface of the pedestal 2. According to the present invention, good working and high reliability of the sensor can be expected.

The invention being thus described, it will be obvious that the same may be varied in many ways. Such variations are not to be regarded as a departure from the spirit and scope of the invention, and all such modifications and intended to be included within the scope of the following claims.

What is claimed is:

1. An assembly positioning an electronic circuit element comprising:

base means for mounting on one surface thereof said electronic circuit element;

at least a pair of apertures formed in said base means;

a supporting member disposed under the other surface of said base means opposed to said one surface carrying said electronic circuit element, said supporting member being made of an insulating material; and hooked projections extending from said supporting member and positioned to cooperate with said pair of apertures, said hooked projections being provided with hooks coupling with the perimeter of said electronic circuit element;

said hooked projections extend through said pair of apertures until said hooks are located above said one surface of said base means, and said hooks are coupled with the perimeter of said electronic circuit element to fasten said electronic circuit element to said base means.

2. The assembly of claim 1, further comprising at least a pair of positioning members extending from said supporting member, said positioning members engaging with coupling means formed in said base means along a line transverse to a line through said pair of apertures.

* * * * *